(12) United States Patent
Lee et al.

(10) Patent No.: US 10,410,689 B2
(45) Date of Patent: Sep. 10, 2019

(54) REGULATOR, MEMORY SYSTEM HAVING THE SAME, AND OPERATING METHOD THEREOF

(71) Applicant: SK hynix Inc., Gyeonggi-do (KR)

(72) Inventors: Jae Ho Lee, Seoul (KR); Tei Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/032,672

(22) Filed: Jul. 11, 2018

(65) Prior Publication Data

US 2019/0189165 A1 Jun. 20, 2019

(30) Foreign Application Priority Data

Dec. 14, 2017 (KR) .................. 10-2017-0172067

(51) Int. Cl.
| | | |
|---|---|---|
| *G11C 5/14* | (2006.01) | |
| *G11C 11/4074* | (2006.01) | |
| *G11C 11/4099* | (2006.01) | |
| *G05F 1/56* | (2006.01) | |

(52) U.S. Cl.
CPC ............... *G11C 5/147* (2013.01); *G05F 1/56* (2013.01); *G11C 5/145* (2013.01); *G11C 11/4074* (2013.01); *G11C 11/4099* (2013.01)

(58) Field of Classification Search
CPC .......... G11C 5/147; G11C 5/4074; G05F 1/56
See application file for complete search history.

(56) References Cited

U.S. PATENT DOCUMENTS

| | | | | |
|---|---|---|---|---|
| 2013/0106501 A1* | 5/2013 | Yoo | ........................... | G05F 1/56 |
| | | | | 327/538 |
| 2013/0300389 A1* | 11/2013 | Lee | ......................... | G05F 1/565 |
| | | | | 323/282 |

FOREIGN PATENT DOCUMENTS

| | | |
|---|---|---|
| KR | 1020140078986 | 6/2014 |
| KR | 1020170063226 | 6/2017 |

* cited by examiner

*Primary Examiner* — Hoai V Ho
*Assistant Examiner* — Jay W. Radke
(74) *Attorney, Agent, or Firm* — IP & T Group LLP (57) ABSTRACT

A regulator includes: a comparator for generating a comparison signal by comparing a feedback voltage obtained by dividing an output voltage with a reference voltage; a current supply switch for controlling a current amount of a pump voltage applied to a first node in response to the output voltage; a control circuit for controlling a potential of an internal node in response to the comparison signal; and a current supply circuit for supplying a current through the first node and to apply the current to the internal node, and generating the output voltage by controlling an amount of current applied to an output node according to a potential level of the internal node.

19 Claims, 6 Drawing Sheets

REGULATOR, MEMORY SYSTEM HAVING THE SAME, AND OPERATING METHOD THEREOF

CROSS-REFERENCE TO RELATED APPLICATION

The present application claims priority under 35 U.S.C. § 119(a) to Korean patent application number 10-2017-0172067, filed on Dec. 14, 2017, which is incorporated herein by reference in its entirety.

BACKGROUND

1. Field of Invention

An aspect of the present disclosure relates to an electronic device, and more particularly, to a regulator, a memory system having the same, and an operating method thereof.

2. Description of the Related Art

As mobile information devices using memory systems as storage media, particularly, smartphones, tablet PCs, and the like are increasingly used, the interest and importance of memory devices have further increased.

As various applications appear, in addition to parallelization, using high-speed processors or multicores, operation demand levels for semiconductor memory systems have continuously increased in terms of not only performance but also reliability.

A memory system is a storage device implemented using a semiconductor such as silicon (Si), germanium (Ge), gallium arsenide (GaAs), or indium phosphide (InP). The memory system may be generally classified into a volatile memory device and a nonvolatile memory device. The volatile memory device is a memory device which loses stored data when a power supply is cut off. Examples of the volatile memory device include a Static Random Access Memory (SRAM), a Dynamic RAM (DRAM), a Synchronous DRAM (SDRAM), and the like. The nonvolatile memory device is a memory device which retains stored data even when a power supply is cut off. Examples of the nonvolatile memory device include a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally classified into a NOR type flash memory and a NAND type flash memory.

The memory system may include a memory device for storing data, a controller for controlling the memory device, and a regulator for stably supplying a voltage to the memory device.

SUMMARY

Embodiments provide a regulator capable of reducing current consumption, a memory system having the same, and an operating method thereof.

In accordance with an aspect of the present disclosure, there is provided a regulator including: a comparator configured to generate a comparison signal by comparing a feedback voltage obtained by dividing an output voltage with a reference voltage; a current supply switch configured to control a current amount of a pump voltage applied to a first node in response to the output voltage; a control circuit configured to control a potential of an internal node in response to the comparison signal; and a current supply circuit configured to be supplied with a current through the first node and to apply the current to the internal node, and generate the output voltage by controlling an amount of current applied to an output node according to a potential level of the internal node.

In accordance with an aspect of the present disclosure, there is provided a memory system including: a memory device configured to store data; and a controller configured to control the memory device, wherein the memory device includes a regulator configured to supply a constant output voltage for overall operations thereof, wherein the regulator includes: a comparator configured to generate a comparison signal by comparing a feedback voltage obtained by dividing the output voltage with a reference voltage; a current supply switch configured to control a current amount of a pump voltage applied to a first node in response to the output voltage; a control circuit configured to control a potential of an internal node in response to the comparison signal; and a current supply circuit configured to be supplied with a current through the first node and to apply the current to the internal node, and generate the output voltage by controlling an amount of current applied to an output node according to a potential level of the internal node.

In accordance with an aspect of the present disclosure, there is provided a method for operating a regulator, the method including: applying a pump voltage to a first node, wherein an amount of current applied to the first node is controlled in response to an output voltage; applying the current applied to the first node to an internal node, and controlling a potential level of the internal node by comparing a feedback voltage obtained by dividing the output voltage with a reference voltage; and generating the output voltage by controlling an amount of current applied to an output node in response to the potential level of the internal node.

In accordance with an aspect of the present disclosure, there is provided a regulator for use in a memory system including: a depletion high voltage transistor configured to control an amount of a pump current according to an output voltage; and a voltage generation circuit configured to generate the output voltage by further controlling the amount of the pump current according to levels of the output voltage and a reference voltage.

BRIEF DESCRIPTION OF THE DRAWINGS

Example embodiments will now be described more fully hereinafter with reference to the accompanying drawings; however, the examples may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
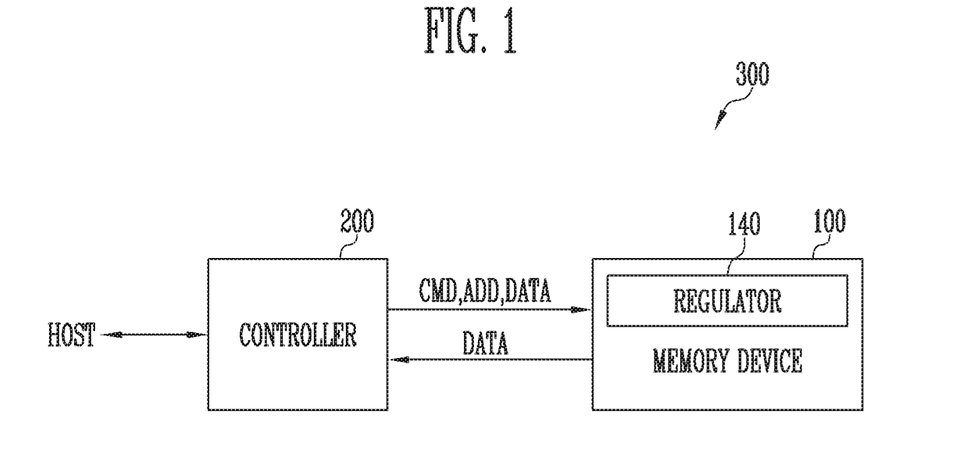
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 300 includes a memory device 100 and a controller 200.

The memory device 100 operates under the control of the controller 200. The memory device 100 includes a memory cell array having a plurality of memory blocks. As an example, the memory device 100 may be a flash memory device.

The memory device 100 is configured to receive a command CMD and an address ADD from the controller 200 through a channel and access an area selected by the address ADD in the memory cell array. That is, the memory device 100 performs an internal operation corresponding to the command CMD on the area selected by the address ADD.

For example, the memory device 100 may perform overall operations including a program operation, a read operation, an erase operation, and the like. In the program operation, the memory device 100 may program data DATA in the area selected by the address ADD. In the read operation, the memory device 100 may read data DATA from the area selected by the address ADD. In the erase operation, the memory device 100 may erase data stored in the area selected by the address ADD.

The memory device 100 includes a regulator 140. The regulator 140 may be configured to allow a certain voltage to be stably supplied in the overall operations of the memory device 100.

The controller 200 controls the memory device 100 through the channel. The controller 200 commands the memory device 100 in response to a request from a host.

As an example, the controller 200 may control the memory device to perform a program operation, a read operation, an erase operation, or the like. In the program operation, the controller 200 may provide a program command CMD, an address ADD, and data DATA to the memory device 100 through the channel. In the read operation, the controller 200 may provide a read command CMD and an address ADD to the memory device 100 through the channel. In the erase operation, the controller 200 may provide an erase command CMD and an address ADD to the memory device 100 through the channel.

Figure 2:
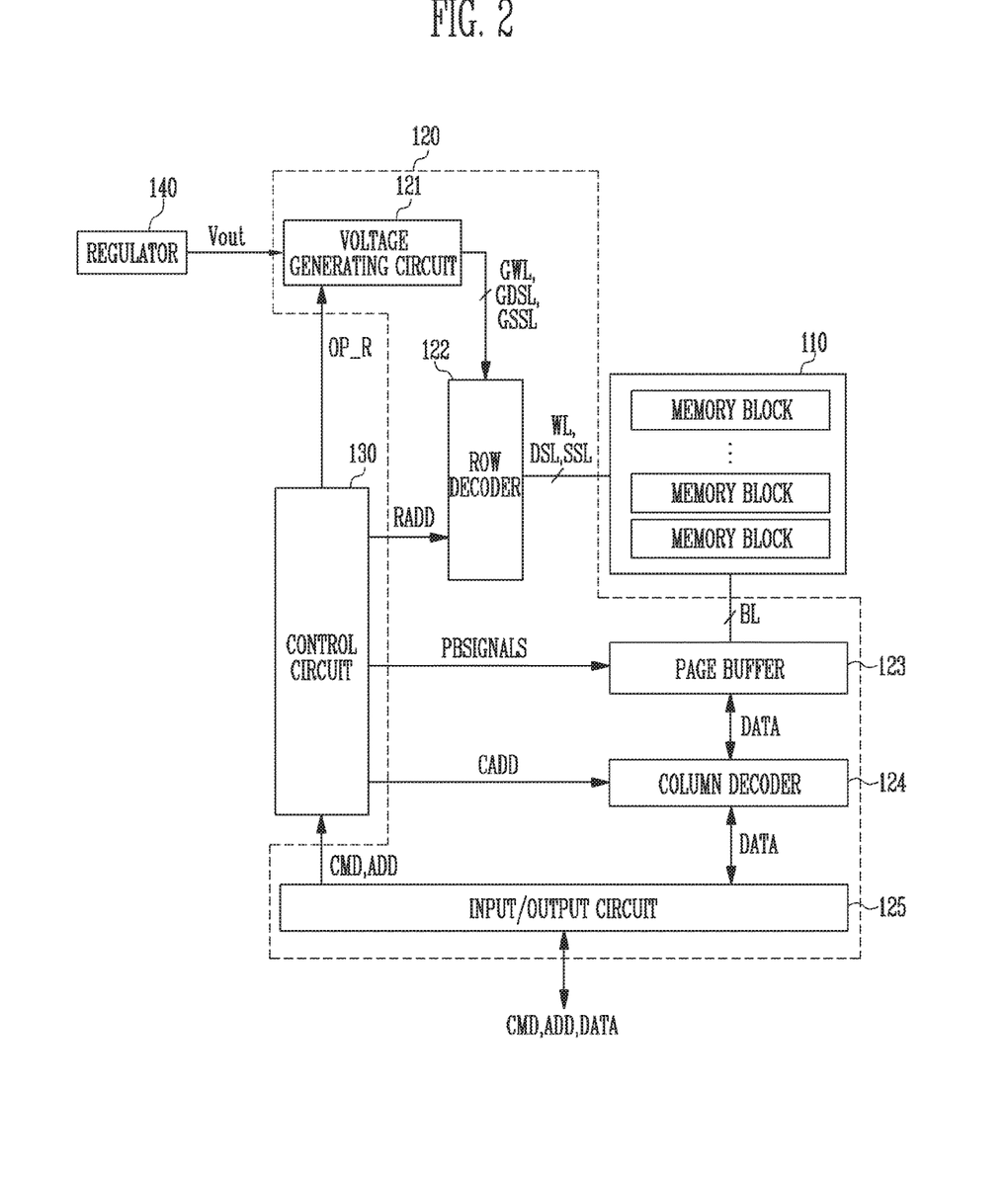
FIG. 2 is a diagram illustrating in detail a memory device of FIG. 1.

FIG. 2 is a diagram illustrating in detail the memory device of FIG. 1.

Referring to FIG. 2, the memory device 100 includes a memory cell array 110 for storing data, a peripheral circuit 120 configured to perform a program operation, a read operation, or an erase operation of the memory cell array 110, a control circuit 130 configured to control the peripheral circuit 120, and a regulator 140 for supplying a stable output voltage Vout to the peripheral circuit 120.

The memory cell array 110 includes a plurality of memory blocks configured identically to one another. Each of the memory blocks includes a plurality of strings. The plurality of strings include a plurality of memory cells that store data, and may be formed in a two-dimensional structure in which the memory cells are arranged horizontally to a substrate or a three-dimensional structure in which the memory cells are arranged vertically to the substrate. Each of the memory cells may be configured as a single level cell (SLC) which can store data of one bit, or be configured as a multi-level cell (MLC), a triple level cell (TLC), or a quadruple level cell (QLC), which can store data of 2 bits or more. For example, the MLC is a memory cell in which data of two bits is stored, the TLC is a memory cell in which data of three bits is stored, and the QLC is a memory cell in which data of four bits is stored. Among memory cells included in different strings, a group of memory cells coupled to the same word line is referred to as a page.

The peripheral circuit 120 includes a voltage generating circuit 121, a row decoder 122, a page buffer 123, a column decoder 124, and an input/output circuit 125.

The voltage generating circuit 121 generates operating voltages having various levels by using the output voltage Vout in response to an operating signal OP_R. For example, in a program operation, the voltage generating circuit 121 may generate a program voltage, a pass voltage, a turn-on voltage, and the like, and transfer the generated voltages to global word lines, global drain select lines, and global source select lines.

The row decoder 122 may be coupled to the voltage generating circuit 121 through global word lines GWL, global drain select lines GDSL, and global source select lines GSSL, and be coupled to the memory cell array 110 through word lines WL, drain select lines DSL, and source select lines SSL. The row decoder 122 transfers the operating voltages generated from the voltage generating circuit 121 to a selected memory block included in the memory cell array 110 in response to a row address RADD. For example, the row decoder 122 may transfer voltages applied to the global word lines GWL to the word lines WL, transfer voltages applied to the global drain select lines GDSL to the drain select lines DSL, and transfer voltages applied to the global source select lines GSSL to the source select lines SSL.

The page buffer 123 may be commonly coupled to the memory blocks included in the memory cell array 110 through bit lines BL. The page buffer 123 may precharge the bit lines BL in response to page buffer control signals PBSIGNALS, communicate data with a selected memory block in program and read operations, or temporarily store transferred data.

The column decoder 124 may communicate data DATA with the page buffer 123 or communicate data DATA with the input/output circuit 125, in response to a column address CADD.

The input/output circuit 125 may transfer a command CMD and an address ADD, which are transferred from the outside, and transmit data DATA transferred from the outside to the column decoder 124 or output data DATA transferred from the column decoder 124 to the outside.

The control circuit 130 controls the peripheral circuit 120 in response to the command CMD and the address ADD.

The regulator 140 may change a pump voltage to a certain level and output the pump voltage as the output voltage Vout. Also, the regulator 140 may generate the output voltage Vout by regulating the pump voltage to various potential levels in accordance with the overall operations of the memory device 100.

In the present disclosure, it is illustrated that the output voltage Vout output from the regulator 140 is supplied to the voltage generating circuit 121. However, the present disclosure is not limited thereto, and the output voltage Vout may be supplied to various circuit components included in the memory device 100. The memory device 100 may be supplied with the output voltage Vout to operate.

Figure 3:
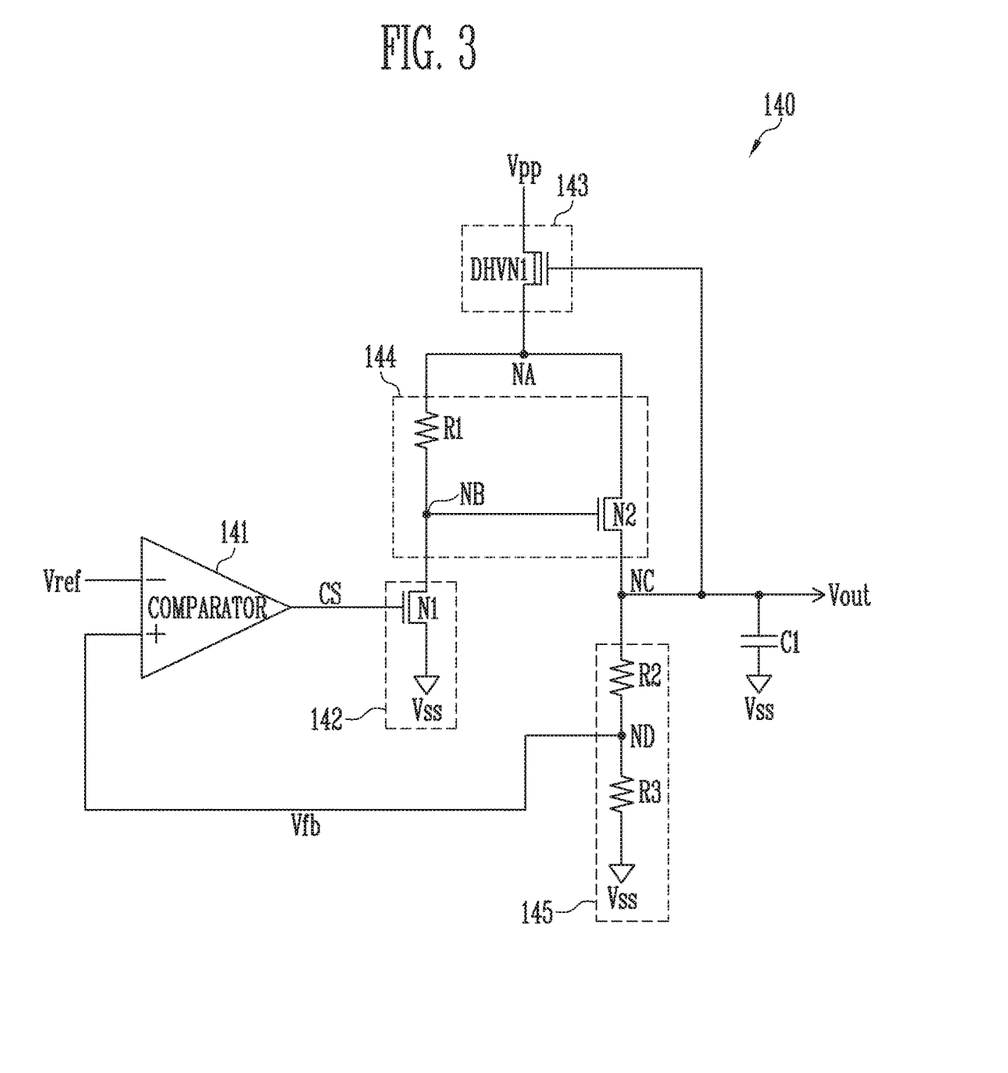
FIG. 3 is a diagram illustrating in detail an embodiment of a regulator of FIG. 2.

FIG. 3 is a diagram illustrating in detail an embodiment of the regulator of FIG. 2.

Referring to FIG. 3, the regulator 140 includes a comparator 141, a control circuit 142, a current supply switch 143, a current supply circuit 144, and a voltage divider 145.

The comparator 141 outputs a comparison signal CS by comparing a reference voltage Vref and a feedback voltage Vfb obtained by voltage-dividing an output voltage Vout. For example, when the reference voltage Vref is larger than the feedback voltage Vfb, the comparator 141 outputs the comparison signal Cs having a low level. When the reference voltage Vref is smaller than the feedback voltage Vfb, the comparator 141 outputs the comparison signal CS having a high level.

The control circuit 142 is configured to include an NMOS transistor N1. The NMOS transistor N1 is coupled between a node NB and a ground power source Vss, and controls a potential of the node NB by forming a current path flowing in the ground power source Vss in response to the comparison signal CS. The control circuit 142 may be configured to additionally include a diode coupled between the NMOS transistor N1 and the ground power source Vss so as to stabilize the current path.

The current supply switch 143 supplies a pump voltage Vpp applied from the outside to a power input node NA of the regulator 140. The current supply switch 143 may be configured as a depletion high voltage NMOS transistor DHVN1. The depletion high voltage NMOS transistor DHVN1 may control a current amount of the pump voltage Vpp supplied to the power input node NA according to the potential level of the output voltage Vout. For example, when the potential level of the output voltage Vout is relatively high, the current amount of the pump voltage Vpp supplied to the power input node NA may be increased. When the potential level of the output voltage Vout is relatively low, the current amount of the pump voltage Vpp supplied to the power input node NA may be decreased.

The current supply circuit 144 includes a resistor R1 and an NMOS transistor N2. The resistor R1 is coupled between the power input node NA and the node NB to supply a current to the node NB. The NMOS transistor N2 is coupled between the powerinput node NA and an output node NC.

The NMOS transistor N2 controls an amount of current applied to the output node NC in response to a potential level of the node NB.

The voltage divider 145 includes resistors R2 and R3. The resistors R2 and R3 are coupled in series between the output node NC and the ground power source Vss. The resistors R2 and R3 generate the feedback voltage Vfb by dividing a potential of the output node NC according to resistance values thereof.

Additionally, the regulator 140 may include a capacitor C1 coupled to the output node NC. The capacitor C1 may stabilize a potential level of the output node NC.

An operation of the regulator 140 in accordance with the embodiment of the present disclosure will be described as follows with reference to FIG. 3.

1) When Output Voltage Vout is Lower Than Target Voltage

When the output voltage Vout is lower than a target voltage, the feedback voltage Vfb generated by dividing the output voltage Vout is lower than the reference voltage Vref. Thus, the comparator 141 outputs the comparison signal having the low level.

The control circuit 142 blocks the current path in response to the comparison signal CS having the low level. That is, the NMOS transistor N1 is turned off in response to the comparison signal CS having the low level, and therefore, the current path flowing through the control circuit 142 is blocked.

As the current path of the control circuit 142 is blocked, the potential of the node NB of the current supply circuit 144 is increased. Thus, the amount of current supplied to the output node NC through the NMOS transistor N2 is increased. Accordingly, the potential of the output voltage Vout is increased.

2) When Output Voltage Vout is Higher Than Target Voltage

When the output voltage Vout is higher than the target voltage, the feedback voltage Vfb generated by dividing the output voltage Vout is higher than the reference voltage Vref. Thus, the comparator 141 outputs the comparison signal having the high level.

The control circuit 142 forms a current path in response to the comparison signal CS having the high level. That is, the NMOS transistor N1 is turned on in response to the comparison signal CS having the high level, and therefore, the current path flowing through the control circuit 142 is formed.

As the current path of the control circuit 142 is formed, the potential of the node NB of the current supply circuit 144 is decreased. Thus, as the amount of current supplied to the output node NC through the NMOS transistor N2 is decreased, the potential level of the output voltage Vout is lowered.

As such, the regulator 140 may control the output voltage Vout to have a target output voltage level according to the level of the reference voltage Vref.

For example, if the level of the reference voltage Vref is set to be high, the target output voltage level of the output voltage Vout is also increased. If the level of the reference voltage Vref is set to be low, the target output voltage level of the output voltage Vout is also decreased.

In the regulator 140, the amount of power consumption may be changed according to a difference in target output voltage level of the output voltage Vout. For example, the amount of current flowing through the resistor R1 and the NMOS transistor N1 is changed depending on the node NB influenced by the potential level of the output voltage Vout.

However, in the embodiment of the present disclosure, the current amount of the pump voltage Vpp applied to the power supply node NA through the current supply switch 143 can be controlled according to the potential level of the output voltage Vout. For example, when the potential level of the output voltage Vout is relatively high, the potential level applied to a gate of the depletion high voltage NMOS transistor DHVN1 constituting the current supply switch 143 is increased, and therefore, the current amount of the pump voltage Vpp applied to the power supply node NA is increased. When the potential level of the output voltage Vout is relatively low, the potential level applied to the gate of the depletion high voltage NMOS transistor DHVN1 is decreased, and therefore, the current amount of the pump voltage Vpp applied to the power supply node NA is decreased. Accordingly, although the target output voltage level of the output voltage Vout is changed, the difference between potential levels at both ends of the resistor R1 can be maintained substantially constant. Thus, although the target output voltage level of the output voltage Vout is changed, the amount of current flowing through the resistor R1 and the NMOS transistor N1 is controlled as substantially constant, so that the amount of current consumption can be stably reduced. In addition, additional signals and circuits for compensating for this are not required, so that the amount of current consumption can also be reduced.

Figure 4:
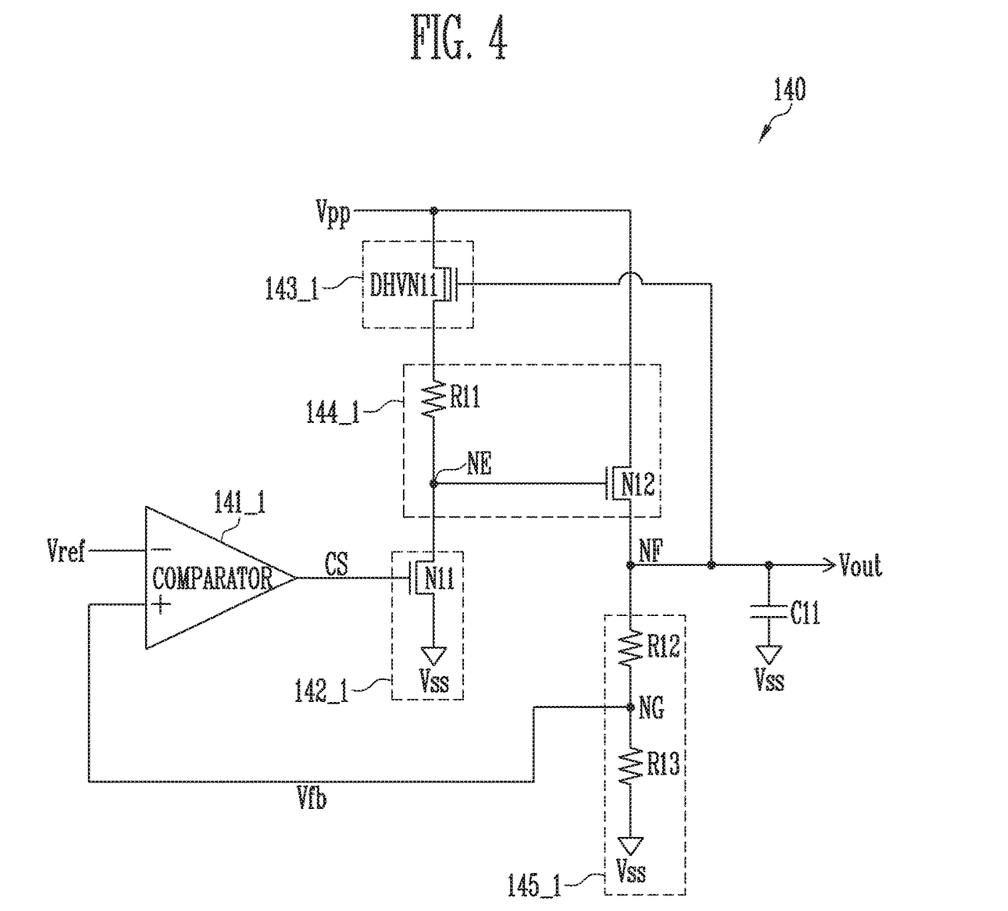
FIG. 4 is a diagram illustrating another embodiment of the regulator of FIG. 2.

FIG. 4 is a diagram illustrating another embodiment of the regulator of FIG. 2.

Referring to FIG. 4, the regulator 140 includes a comparator 141_1 a control circuit 142_1, a current supply switch 143_1, a current supply circuit 144_1, and a voltage divider 145_1.

The comparator 141_1 outputs a comparison signal CS by comparing a reference voltage Vref and a feedback voltage Vfb obtained by voltage-dividing an output voltage Vout. For example, when the reference voltage Vref is larger than the feedback voltage Vfb, the comparator 141_1 outputs the comparison signal Cs having a low level. When the reference voltage Vref is smaller than the feedback voltage Vfb, the comparator 141_1 outputs the comparison signal CS having a high level.

The control circuit 142_1 is configured to include an NMOS transistor N11. The NMOS transistor N11 is coupled between a node NE and a ground power source Vss, and controls a potential of the node NE by forming a current path flowing in the ground power source Vss in response to the comparison signal CS. The control circuit 142_1 may be configured to additionally include a diode coupled between the NMOS transistor N11 and the ground power source Vss so as to stabilize the current path.

The current supply switch 143_1 supplies a pump voltage Vpp applied from the outside to a resistor R11 of the regulator 140. The current supply switch 143_1 may be configured as a depletion high voltage NMOS transistor DHVN1. The depletion high voltage NMOS transistor DHVN1 may control a current amount of the pump voltage Vpp supplied to the resistor R11 according to the potential level of the output voltage Vout. For example, when the potential level of the output voltage Vout is relatively high, the current amount of the pump voltage Vpp supplied to the resistor R11 may be increased. When the potential level of the output voltage Vout is relatively low, the current amount of the pump voltage Vpp supplied to the resistor R11 may be decreased.

The current supply circuit 144_1 includes the resistor R11 and an NMOS transistor N12. The resistor R11 is coupled between the current supply switch 143_1 and the node NE to supply a current to the node NE. The NMOS transistor N12 is coupled between a node to which the pump voltage Vpp is applied and an output node NF. The NMOS transistor N12 controls an amount of current applied to the output node NF in response to a potential level of the node NE.

The voltage divider 145_1 includes resistors R12 and R13. The resistors R12 and R13 are coupled in series between the output node NF and the ground power source Vss. The resistors R12 and R13 generate the feedback voltage Vfb by dividing a potential of the output node NF according to resistance values thereof.

Additionally, the regulator 140 may include a capacitor C11 coupled to the output node NF. The capacitor C11 may stabilize a potential level of the output node NF.

An operation of the regulator 140 in accordance with the embodiment of the present disclosure will be described as follows with reference to FIG. 4.

1) When Output Voltage Vout is Lower Than Target Voltage

When the output voltage Vout is lower than a target voltage, the feedback voltage Vfb generated by dividing the output voltage Vout is lower than the reference voltage Vref. Thus, the comparator 141_1 outputs the comparison signal having the low level.

The control circuit 142_1 blocks the current path in response to the comparison signal CS having the low level. That is, the NMOS transistor N11 is turned off in response to the comparison signal CS having the low level, and therefore, the current path flowing through the control circuit 142_2 is blocked.

As the current path of the control circuit 142_1 is blocked, the potential of the node NE of the current supply circuit 144_1 is increased. Thus, the amount of current supplied to the output node NF through the NMOS transistor N12 is increased. Accordingly, the potential of the output voltage Vout is increased.

2) When Output Voltage Vout is Higher Than Target Voltage

When the output voltage Vout is higher than the target voltage, the feedback voltage Vfb generated by dividing the output voltage Vout is higher than the reference voltage Vref. Thus, the comparator 141_1 outputs the comparison signal having the high level.

The control circuit 142_1 forms a current path in response to the comparison signal CS having the high level. That is, the NMOS transistor N11 is turned on in response to the comparison signal CS having the high level, and therefore, the current path flowing through the control circuit 142_1 is formed.

As the current path of the control circuit 142_1 is formed, the potential of the node NE of the current supply circuit 144_1 is decreased. Thus, as the amount of current supplied to the output node NF through the NMOS transistor N12 is decreased, the potential level of the output voltage Vout is lowered.

As such, the regulator 140 may control the output voltage Vout to have a target output voltage level according to the level of the reference voltage Vref.

For example, if the level of the reference voltage Vref is set to be high, the target output voltage level of the output voltage Vout is also increased. In the embodiment of the present disclosure, the control circuit 142_1 can control a voltage of a node coupled to the resistor R11 according to the potential level of the output voltage Vout. That is, although the potential level of the node NE is changed depending on the potential level of the output voltage Vout, the control circuit 142_1 controls the voltage of the node coupled to the resistor R11, so that the difference between voltages at both ends of the resistor R11 can be maintained as substantially constant. Accordingly, although the target output voltage level of the output voltage Vout is changed, the difference between potential levels at both ends of the resistor R11 can be maintained as substantially constant. Thus, although the target output voltage level of the output voltage Vout is changed, the amount of current flowing through the resistor R11 and the NMOS transistor N11 is controlled as substantially constant, so that the amount of current consumption can be stably reduced. In addition, additional signals and circuits for compensating for this are not required, so that the amount of current consumption can also be reduced.

Also, unlike the regulator 140 shown in FIG. 3, the regulator 140 shown in FIG. 4 is designed such that the pump voltage Vpp is directly applied to the NMOS transistor N12. Accordingly, a voltage difference VDS between a drain and a source of the NMOS transistor N12 can be secured. Thus, a regulating operation can be more stably performed.

Figure 5:
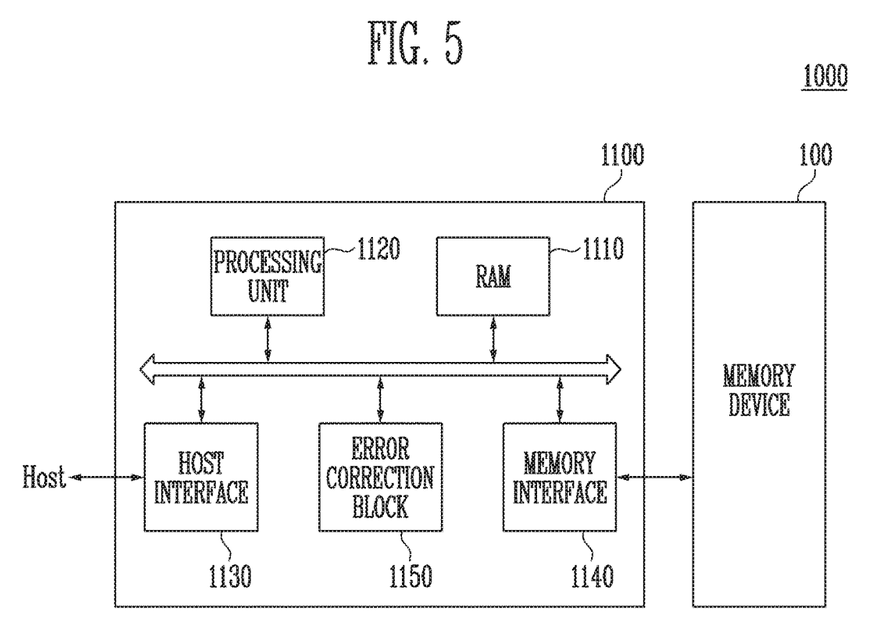
FIG. 5 is a block diagram illustrating another embodiment of the memory system.

FIG. 5 is a block diagram illustrating another embodiment of the memory system.

Referring to FIG. 5, the memory system 1000 includes a memory device 100 and the controller 1100.

The memory device 100 may be configured and operated identically to the memory device described with reference to FIG. Hereinafter, overlapping descriptions will be omitted.

The controller 1100 is coupled to a host Host and the memory device 100. The controller 1100 is configured to access the memory device 100 in response to a request from the host Host. For example, the controller 1100 is configured to control read, write, erase, and background operations of the memory device 100. The controller 1100 is configured to provide an interface between the memory device 100 and the host Host. The controller 1100 is configured to drive firmware for controlling the memory device 100.

The controller 1100 includes a random access memory (RAM) 1110, a processing unit 1120, a host interface 1130, a memory interface 1140, and an error correction block 1150.

The RAM 1110 is used as at least one of a working memory of the processing unit 1120, a cache memory between the memory device 100 and the host Host, and a buffer memory between the memory device 100 and the host Host.

The processing unit 1120 controls overall operations of the controller 1100. In addition, the controller 1100 may temporarily store program data provided from the host Host in a write operation.

The host interface 1130 includes a protocol for exchanging data between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the memory device 100. For example, the memory interface 1140 may include a NAND interface or a NOR interface.

The error correction block 1150 is configured to detect and correct an error of data received from the memory device 100 by using an error correction code (ECC). The processing unit 1120 may control the memory device 100 to adjust a read voltage, based on an error detection result of the error correction block 1150, and to perform re-reading. In an exemplary embodiment, the error correction block 1150 may be provided as a component of the controller 1100.

The controller 1100 and the memory device 100 may be integrated into one semiconductor device. In an exemplary embodiment, the controller 1100 and the memory device 100 may be integrated into one semiconductor device, to constitute a memory card. For example, the controller 1100 and the memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 100 or the memory system 1000 may be packaged in various forms. For example, the memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 6:
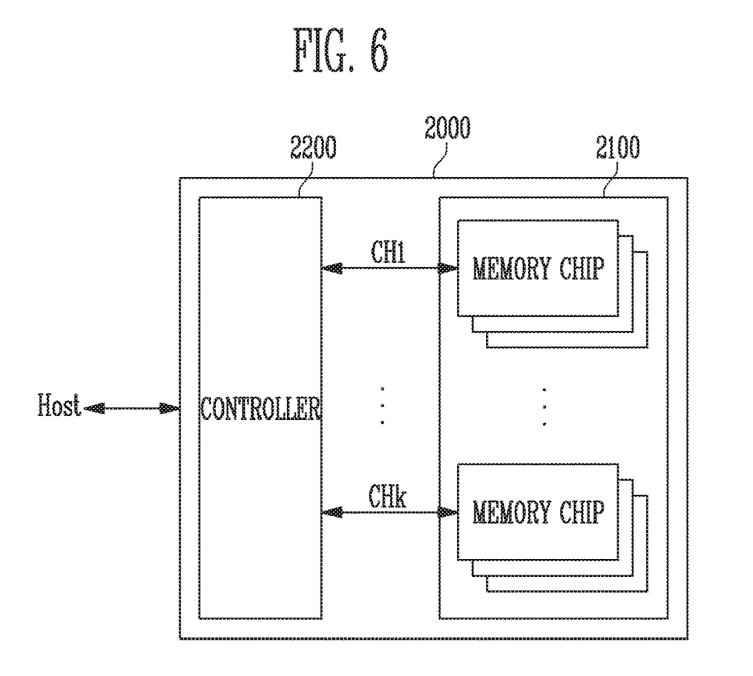
FIG. 6 is a block diagram illustrating an application example of the memory system of FIG. 5.

FIG. 6 is a block diagram illustrating an application example of the memory system of FIG. 5.

Referring to FIG. 6, the memory system 2000 includes a memory device 2100 and a controller 2200. The memory device 2100 includes a plurality of semiconductor memory chips. The plurality of semiconductor memory chips are divided into a plurality of groups.

In FIG. 6, it is illustrated that the plurality of groups communicate with the controller 2200 through first to kth channels CH1 to CHk. Each semiconductor memory chip may be configured and operated identically to the memory device 100 described with reference to FIG. 1.

Each group is configured to communicate with the controller 2200 through one common channel. The controller 2200 is configured identically to the controller 1100 described with reference to FIG. 5. The controller 2200 is configured to control the plurality of memory chips of the memory device 2100 through the plurality of channels CH1 to CHk.

Figure 7:
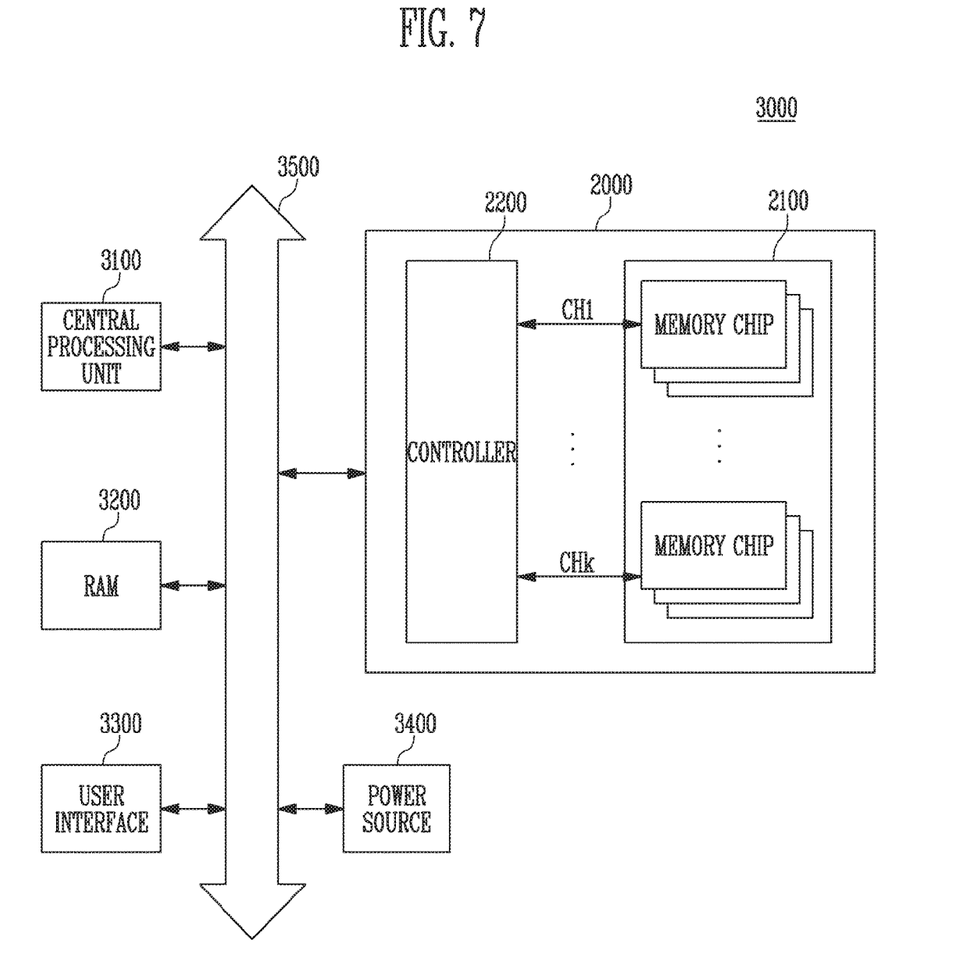
FIG. 7 is a block diagram illustrating a computing system including the memory system described with reference to FIG. 6.

FIG. 7 is a block diagram illustrating a computing system including the memory system described with reference to FIG. 6.

Referring to FIG. 7, the computing system 300 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 7, it is illustrated that the memory device 2100 is coupled to the system bus 3500 through the controller 2200. However, the memory device 2100 may be directly coupled to the system bus 3500. In this case, the function of the controller 2200 may be performed by the central processing unit 3100 and the RAM 3200.

In FIG. 7, it is illustrated that the memory system 2000 described with reference to FIG. 6 is provided. However, the memory system 2000 may be replaced by the memory system 1000 described with reference to FIG. 5. In an exemplary embodiment, the computing system 3000 may be configured to include both the memory systems 1000 and 2000 described with reference to FIGS. 5 and 6.

In accordance with the present disclosure, in an operation of the regulator, the current amount of the pump voltage is controlled in response to the output voltage, so that it is possible to reduce a difference in powerconsumption.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A regulator comprising:
    a comparator configured to generate a comparison signal by comparing a feedback voltage, obtained by dividing an output voltage, with a reference voltage;
    a current supply switch configured to control a current amount of a pump voltage applied to a first node in response to the output voltage;
    a control circuit configured to control a potential of an internal node in response to the comparison signal; and
    a current supply circuit configured to be supplied with a current through the first node and to apply the current to the internal node, and generate the output voltage by controlling an amount of current applied to an output node according to a potential level of the internal node.

2. The regulator of claim 1, further comprising a voltage divider configured to generate the feedback voltage by dividing the output voltage.

3. The regulator of claim 1, wherein the current supply switch controls the current amount of the pump voltage applied to the first node in response to the potential level of the output voltage.

4. The regulator of claim 1, wherein the current supply switch includes a depletion high voltage transistor.

5. The regulator of claim 1, wherein the current supply circuit supplies the current supplied through the first node to the internal node, and applies the current supplied through the first node to the output node in response to the potential level of the internal node.

6. The regulator of claim 5, wherein the current supply circuit includes:
    a resistor coupled between the first node and the internal node to transfer the current supplied through the first node to the internal node; and
    a transistor coupled between the first node and the output node, the transistor controlling the amount of current supplied to the output node according to the potential level of the internal node.

7. The regulator of claim 1, wherein the current supply circuit supplies the current supplied through the first node to the internal node, and applies the pump voltage to the output node in response to the potential level of the internal node.

8. The regulator of claim 7, wherein the current supply circuit includes:
    a resistor coupled between the first node and the internal node to transfer the current supplied through the first node to the internal node; and
    a transistor coupled between a node to which the pump voltage is applied and the output node, the transistor controlling the current amount of the pump voltage supplied to the output node according to the potential level of the internal node.

9. A memory system comprising:
    a memory device configured to store data; and
    a controller configured to control the memory device,
    wherein the memory device includes a regulator configured to supply a constant output voltage for overall operations thereof,
    wherein the regulator includes:
        a comparator configured to generate a comparison signal by comparing a feedback voltage, obtained by dividing the output voltage, with a reference voltage;
        a current supply switch configured to control a current amount of a pump voltage applied to a first node in response to the output voltage;

a control circuit configured to control a potential of an internal node in response to the comparison signal; and a current supply circuit configured to be supplied with a current through the first node and to apply the current to the internal node, and generate the output voltage by controlling an amount of current applied to an output node according to a potential level of the internal node.

10. The memory system of claim 9, further comprising a voltage divider configured to generate the feedback voltage by dividing the output voltage.

11. The memory system of claim 9, wherein the current supply switch controls the current amount of the pump voltage applied to the first node in response to the potential level of the output voltage.

12. The memory system of claim 9, wherein the current supply switch includes a depletion high voltage transistor.

13. The memory system of claim 9, wherein the current supply circuit supplies the current supplied through the first node to the internal node, and applies the current supplied through the first node to the output node in response to the potential level of the internal node.

14. The memory system of claim 13, wherein the current supply circuit includes:
a resistor coupled between the first node and the internal node to transfer the current supplied through the first node to the internal node; and
a transistor coupled between the first node and the output node, the transistor controlling the amount of current supplied to the output node according to the potential level of the internal node.

15. The memory system of claim 9, wherein the current supply circuit supplies the current supplied through the first node to the internal node, and applies the pump voltage to the output node in response to the potential level of the internal node.

16. The memory system of claim 15, wherein the current supply circuit includes:
a resistor coupled between the first node and the internal node to transfer the current supplied through the first node to the internal node; and
a transistor coupled between a node to which the pump voltage is applied and the output node, the transistor controlling the current amount of the pump voltage supplied to the output node according to the potential level of the internal node.

17. A method for operating a regulator, the method comprising:
applying a pump voltage to a first node, wherein an amount of current applied to the first node is controlled in response to an output voltage;
applying the current applied to the first node to an internal node, and controlling a potential level of the internal node by comparing a feedback voltage, obtained by dividing the output voltage, with a reference voltage; and
generating the output voltage by controlling an amount of current applied to an output node in response to the potential level of the internal node.

18. The method of claim 17, wherein, in the generating of the output voltage, the amount of current applied to the output node from the first node in response to the potential level of the internal node.

19. The method of claim 17, wherein, in the generating of the output voltage, the pump voltage is applied to the output node,
wherein a current amount of the pump voltage applied to the output node is controlled in response to the potential level of the internal node.

* * * * *